United States Patent
Sheng et al.

(10) Patent No.: US 6,215,431 B1
(45) Date of Patent: Apr. 10, 2001

(54) DROOP-FREE QUASI-CONTINUOUS RECONSTRUCTION FILTER INTERFACE

(75) Inventors: Samuel W. Sheng, San Jose; Cormac S. Conroy, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/323,670

(22) Filed: Jun. 1, 1999

(51) Int. Cl.[7] ........................................ H03M 1/00
(52) U.S. Cl. ................................. 341/144; 341/150
(58) Field of Search ....................... 341/144, 150

(56) References Cited

U.S. PATENT DOCUMENTS 4,968,989 * 11/1990 Olmstead et al. ............ 341/150
5,561,424 * 10/1996 Norsworthy et al. ......... 341/126

OTHER PUBLICATIONS

Pichler, H. et al, 'The Exponential–Hold Circuit: Properties and Applications', Instrumentation and Measurement Technology Conference, IEEE, pp. 745–750, May 1993.*

International Telecommunication Union, Transmission Systems and Media, "Spitterless Asymmetric Digital Subscriber Line (ADSL) Transceivers", Geneva Switzerland, Oct. 12, 1998, Telecommunication Standardization Sector of ITU, Study Group 15, Chris Hansen, Editor G.992.2, pp. 2–149.

International Telecommunication Union, Transmission Systems and Media, "Asymmetrical Digital Subscriber Line (ADSL) Transceiver", Geneva Switzerland, Oct. 12–23 1998, ITU–Telecommunication Standardization Sector, Editor, G.992.1 (ex: G.dmt)–Stephen Palm, Matsushita Graphic Communication Systems, pp. i–113.

Naus, Peter J.A., et al., "A CMOS Stereo 16–bit D/A Converter for Digital Audio" *IEEE J. Solid–State Circuits*, vol. SC–22, pp. 390–395, Jun. 1987.

Saarela, Kimmo K., "ADSL", Tampere University of Technology Telecommunications Laboratory, P.O. Box 553, 33101 Tampere, Finland, Feb. 17, 1995.

* cited by examiner

*Primary Examiner*—Melvin Marcelo (57) ABSTRACT

A reconstruction filter is described. An input is configured to receive an output signal from a digital to analog converter. An input sampling circuit is operative to store a sample of the output signal from the digital to analog converter. An input pulse generating switch that generates a pulse, the energy of the pulse being determined by the sample of the output signal from the digital to analog converter. An amplifier receives the pulse at an amplifier input and provides an output signal at an amplifier output so that an output signal is produced that reduces distortion caused by imperfections in digital to analog converter.

13 Claims, 9 Drawing Sheets

Figure 3C $$R = \frac{1}{\omega C_s} \quad \omega = \text{Sampling Frequency}$$

DROOP-FREE QUASI-CONTINUOUS RECONSTRUCTION FILTER INTERFACE

CROSS REFERENCE TO RELATED APPLICATIONS

This application is a continuation in part of co-pending U.S. patent application Ser. No. 09/250,426, entitled MUTLIPLEXED CODEC FOR AN ADSL SYSTEM, filed on Feb. 16, 1999, which is incorporated herein by reference for all purposes.

BACKGROUND OF THE INVENTION

1. Field of the Invention

The present invention relates to a droop-free quasi-continuous reconstruction filter interface. More specifically, a reconstruction filter interface is disclosed that resamples the output of a digital-to-analog converter (DAC) and eliminates problems in the output of the DAC such as slewing, glitching, and droop.

2. Description of the Related Art

Asymmetric Digital Subscriber Line (ADSL) technology is used to deliver high-rate digital data over existing phone lines without modification of the phone lines. A modulation scheme called Discrete Multitone (DMT) allows the transmission of high speed digital data. ADSL allows a large bandwidth (1.104 MHz) for transmission in a downstream direction from a central office to a subscriber in a remote location and a lesser bandwidth (138 kHz) for transmission in an upstream direction from of a subscriber in a remote location to a central office. ADSL systems are described further in the ADSL standards ITU-g.992.1 and ITU-g.992.2, which are herein incorporated by reference for all purposes.

Figure 1A:
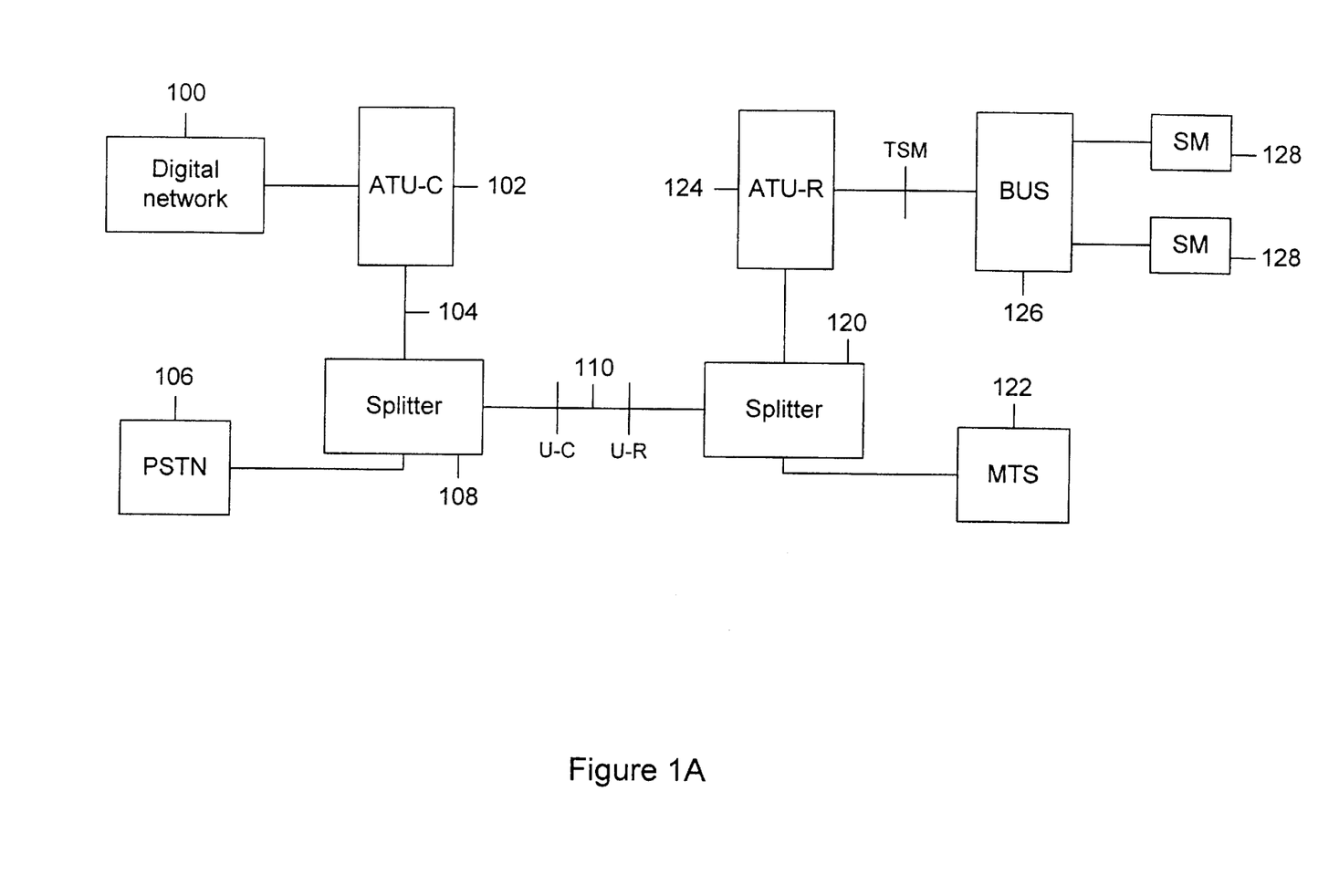
FIG. 1A illustrates the architecture of an ADSL system.

FIG. 1A illustrates the architecture of an ADSL system. A digital network 100 provides data that is to be sent downstream over the ADSL line. The data is delivered to an ADSL transceiver unit in a central office (an ATU-C) 102. The ATU-C modulates data for downstream transmission using a DMT scheme. ATU-C drives a line 104 with an analog signal. Line 104 is connected to a telephone line 110 that is part of a Public Switched Telephone Network (PSTN) 106 by a splitter 108. ATU-C also receives data transmitted in the upstream direction on line 104.

At the receiver end, a splitter 120 splits the signal on line 110 between a message telecommunication service (MTS) 122 (also referred to as plain old telephone service (POTS)) and an ADSL transceiver unit line for a remote unit (an ATU-R) 124. ATU-R 124 is connected to one or more service modules (SM) 128 by a bus 126. The ATU-R demodulates data transmitted by the ATU-C in the downstream direction and also transmits data in the upsteam direction.

Figure 1B:
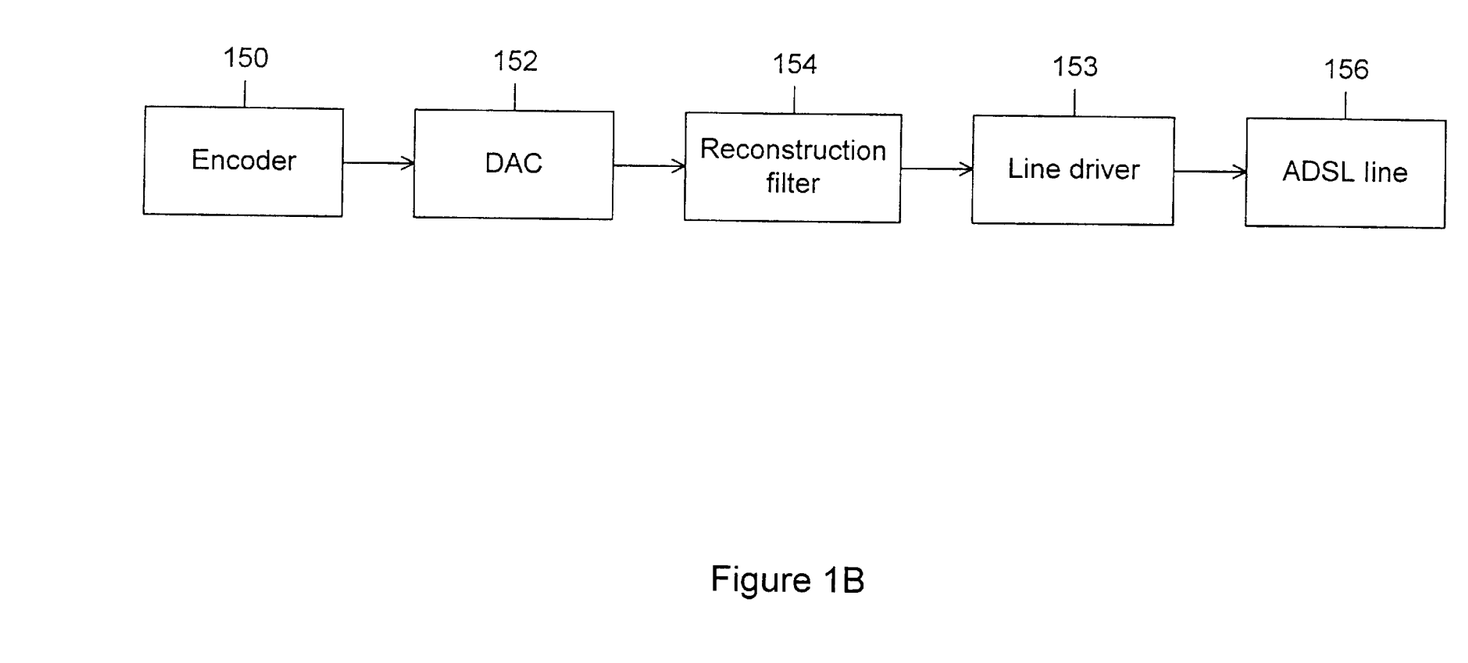
FIG. 1B is a block diagram illustrates the transmission path of an ADSL system.

FIG. 1B is a block diagram illustrates the transmission path of an ADSL system. The transmission path may be in either the upstream or the downstream direction. An encoder 150 sends digital data to a DAC 152. The analog output of DAC 152 represent an ADSL modulated signal that is to be transmitted on an ADSL line. However, the DAC is not a suitable line driver because it generally does not have sufficient power output and also because the output of the DAC contains a large amount of spurious, out of band harmonics generated by the zero order hold nature of a realizable analog DAC. A line driver amplifier 153 is used to increase the power drive capability and a reconstruction filter 154 reduces or eliminates the out of band harmonics. The output of the DAC is directed to reconstruction filter 154 and the output of reconstruction filter 154 is directed to line drive amplifier 153. Reconstruction filter 154 reconstructs the signal from the stairstep output of the DAC for the purpose of driving an ADSL line 156. Thus, the signal that drives ADSL line 156 is first generated digitally by encoder 150. DAC 152 converts the digital signal to an analog signal and reconstruction filter 154 drives the line driver, which in turn directs the signal into the line proper.

The performance of reconstruction filter 154 is important because, without reconstruction filter 154, the output of the ADSL transmitter would include residual harmonic energy over a broad spectrum and would likely violate FCC rules as well as have a poorly defined in band spectrum shape. Furthermore, any high frequency glitching and slew energy would be present on the line, further distorting and corrupting the signal.

Figure 2:
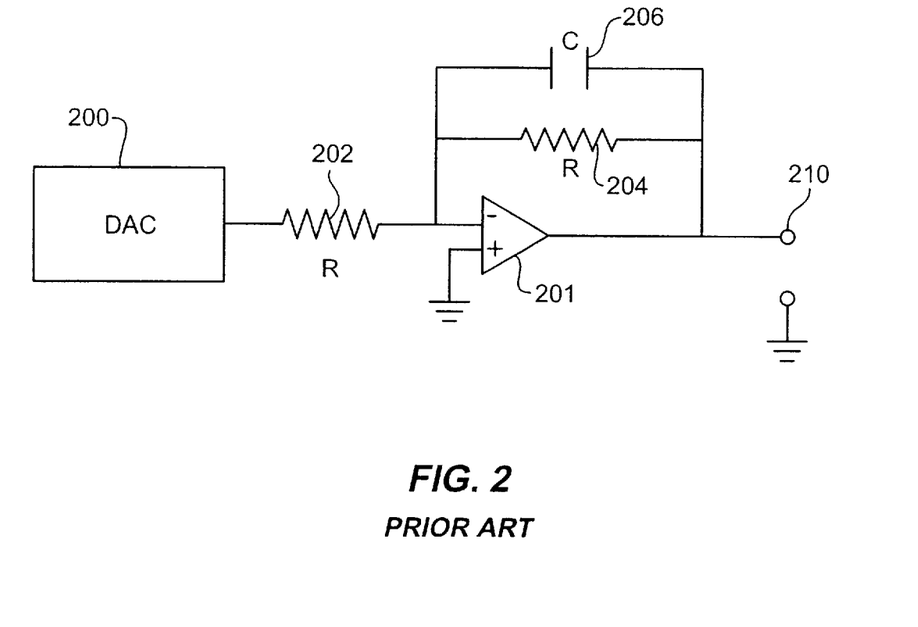
FIG. 2 is a block diagram illustrating the basic structure of a typical reconstruction filter.

FIG. 2 is a block diagram illustrating the basic structure of a typical reconstruction filter. The output of a DAC 200 is input to an amplifier 201 configured in a low pass circuit that includes an input resistor 202, a feedback resistor 204 and a capacitor 206. In this low pass configuration, the output of the amplifier at node 210 tends to follow only the low frequency content of the output of the DAC within the design limitations of amplifier 201, thus achieving reconstruction of the signal.

When the output of the digital-to-analog converter is interfaced directly into the associated reconstruction filter in a continuous time fashion as shown above, several problems arc caused due to the fact that the DAC is inherently discrete time in nature. First, any form of nonlinear settling transient in the DAC such as glitching or slewing distortion is reproduced by the construction filter in the line output. Glitching 320 and slewing 310 are illustrated in FIG. 3B. Also, the fact that the DAC output is a zero order held waveform results in a frequency dependent droop across the output band, which makes necessary some form of X/sin(X) correction either in the digital processing prior to the DAC or in the analog filter itself. Typically, such correction is costly, both in terms of speed and complexity.

It would be desirable if a system could be designed that could eliminate the problems caused by slewing, glitching and droop that result from applying the output of the digital-to-analog converter to the reconstruction filter.

SUMMARY OF THE INVENTION

Accordingly, a system is disclosed that eliminates problems caused by slewing, glitching, and droop from the digital-to-analog converter output by providing a filter that is quasi-continuous. Such a filter can be simultaneously considered to be both discrete time and continuous time in nature. A filter input is disclosed that resamples the DAC output at a single point in time. Because the point in time is selected to be a time at which the DAC output has settled its desired level, slewing and glitching issues arc eliminated. The resampled DAC output is then input into the continuous time filter by using operational amplifiers in the filter itself to force the charge transfer. If the bandwidth of the filter amplifiers is sufficient, this transfer is nearly instantaneous relative to the resampling rate. Thus, instead of a zero order held signal, the filter is fed a sequence of impulses, each impulse being proportional in weight to the resampled DAC output. The result yields an overall output that is droop-free.

In one embodiment, an ADSL transmission system is disclosed. The system includes a digital DMT generating modulation circuit that generates a DMT modulated digital output. An digital to analog converter converts the DMT modulated digital output into a DMT analog signal. A discrete pulse generating circuit samples the DMT analog signal and the discrete pulse generating circuit outputs a pulsed output signal. A reconstruction filter is driven by the pulsed output signal. The reconstruction filter outputs a line driving signal that is suitable to drive an ADSL communication line so that a line driving signal is produced that reduces or eliminates distortion caused by imperfections in the digital to analog converter.

In another embodiment, a method of driving an ADSL communication line with a DMT signal is disclosed. The method includes creating a DMT modulated digital output and converting the DMT modulated digital output to a DMT analog signal. The DMT analog signal is sampled. A discrete pulse output signal is generated from the sampled DMT analog signal. The discrete pulse output signal is input to a reconstruction filter that outputs a line driving signal that is suitable to drive an ADSL communication line.

In another embodiment, a reconstruction filter is disclosed. An input is configured to receive an output signal from a digital to analog converter. An input sampling circuit is operative to store a sample of the output signal from the digital to analog converter. An input pulse generating switch that generates a pulse, the energy of the pulse being determined by the sample of the output signal from the digital to analog converter. An amplifier receives the pulse at an amplifier input and provides an output signal at an amplifier output so that an output signal is produced that reduces distortion caused by imperfections in the analog to digital converter.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details arc set forth in order to provide a thorough understanding of the present invention. The present invention may be practiced without some or all of these specific details. In other instances, well known process operations have not been described in detail in order not to unnecessarily obscure the present invention.

The following description will explain in detail how a droop free reconstruction filter is designed and used to provide a better ADSL transmit signal. It should be appreciated that the reconstruction filter disclosed is also useful for reconstructing the output signal from a DAC used in other applications. DAC's generally require a reconstruction filter of some sort for proper operation and the reconstruction filter described herein is useful in any application that requires the performance achievable with the disclosed design.

Figure 3A:
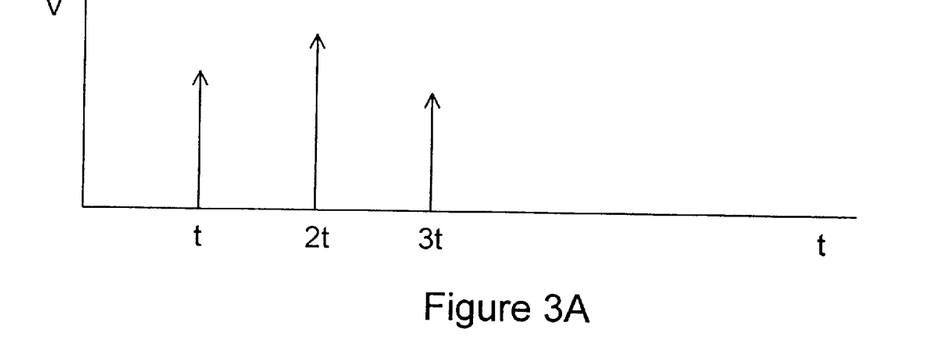
FIG. 3A is a graph illustrating an idealized DAC output.
Figure 3B:
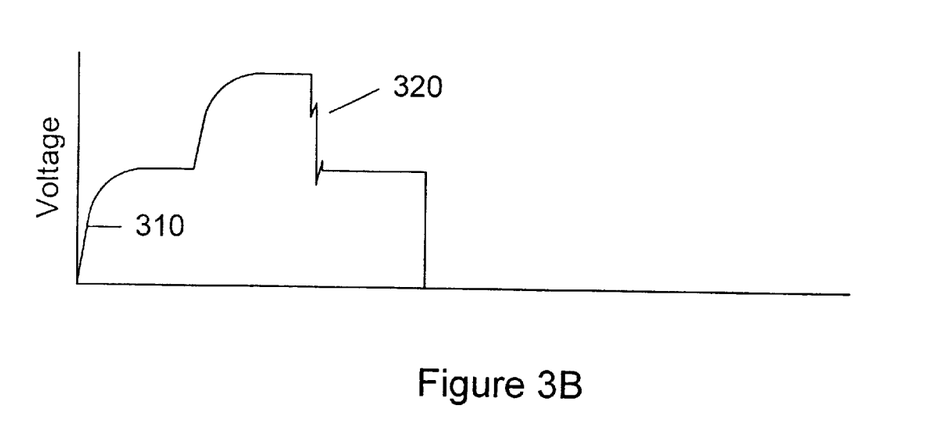
FIG. 3B is a graph illustrating an actual DAC output that illustrates a zero order held signal that includes slewing and glitching.

FIG. 3A is a graph illustrating an idealized DAC output. The output consists of delta functions output periodically from the DAC at a frequency of 1/t. Ideally, the pulses are as short as possible and the energy in each pulse is proportional to the analog signal value being output by the DAC.

FIG. 3B is a graph illustrating an actual DAC output that illustrates a zero order held signal that includes slewing and glitching. Slewing occurs when the amplifier used to create the DAC output does not have sufficient gain to bring the output up to the desired voltage. Slewing is shown by the straight portion of the output 310. Slewing is particularly a problem because it is a nonlinear effect that has an undesirable effect on the output. In addition to slewing, glitching is shown at 320. Glitching occurs when the analog "weights" (which may expressed as voltage or current) that form the DAC output are not presented simultaneously. As an example, suppose that the previous DAC input was (in binary) 011111 and that the next input is 100000. Although the increment is very small, it causes all of the bits (and hence all of the analog weights) to attempt to toggle. Because of circuit effects such as unequal propagation delay, the transition from 011111 to 100000 might actually progress as 011111-011010-101010-100000. The two values in the middle represent erroneous DAC outputs. Although this error event, or "glitch" is short lived, it still presents some form of spurious signal energy, corrupting the DAC output.

Figure 3C:
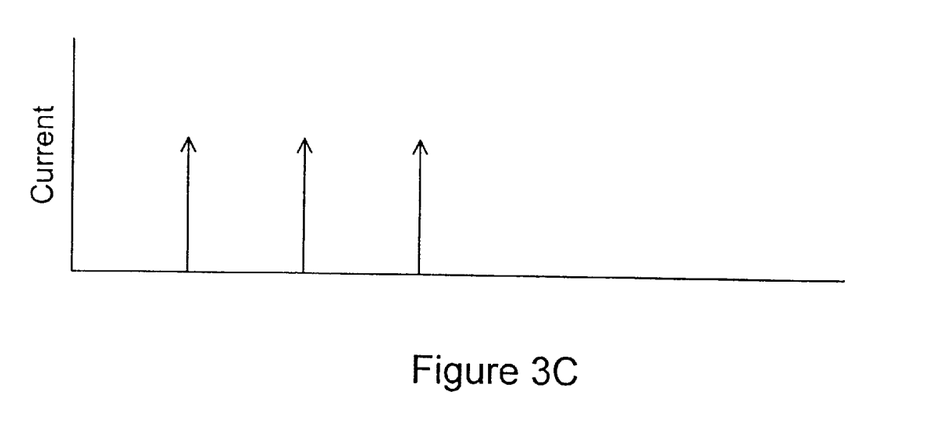
FIG. 3C is a plot of the output of the DAC after it has been resampled.

FIG. 3C is a plot of the output of the DAC after it has been resampled and converted into a current pulse. In one embodiment of the present invention, the output of the DAC is switched into a sampling capacitor that samples the output at a point in time. The resampled DAC output is then input to a reconstruction filter. Preferably, a point is selected when the output of the DAC has settled at the desired voltage. In the illustrated embodiment, the output of the DAC is shown being, sampled at a point ⅔t from the point at which the DAC output began to change. Thus, the sampling clock signal is ⅔ of a period out of phase with the DAC clock. In other embodiments, the amount that the sampling capacitor clock switch is out of phase with the DAC output clock may be varied. Preferably, the sampling instant is set as close as practicable to immediately before the DAC output transition. This provides maximum time for the DAC to settle, thus maximizing the accuracy in the final DAC value that is sampled.

By sampling the output of the DAC at a point where the DAC has settled at the correct voltage, glitching and slewing issues are eliminated. Also, when sampled signal stored in the capacitor is sent into the lowpass filter structure (indicated as the rising edge on φ2 in FIG. 4B), it is effectively "dumped" in as an impulse of current, assuming that the bandwidth of amplifier 410 is much higher than the sampling rate. This eliminates droop, which is the tendency of the output of the filter to become attenuated at high frequencies when the input to the reconstruction filter is a zero order held signal such as is output by the DAC.

A large amount of effort has been expended to eliminate glitching and slewing the output of a DAC or an amplifier. DAC's are available which have reduced these effects significantly. However, such DAC's are costly, especially when they are designed to operate at high frequencies. The reconstruction filter input disclosed herein eliminates the need to provide a special DAC that has reduced glitching and slewing since the reconstruction filter is disconnected from the DAC during the glitching/slewing events. By sampling the DAC output, the effects of glitching and slewing in the DAC can be eliminated in a more efficient manner and zero order hold droop effects are eliminated without the need for costly x/sin x correction. Thus, the disclosed resampling network does not only mitigate glitching and slewing problems; most significantly, it also provides droop compensation. Also, the resampling network is part of the reconstruction filter and so glitching, slewing and droop are all mitigated by the reconstruction filter and not by separate circuits as done in the prior art. The disclosed integrated solution consumes less power and area than other techniques.

Figure 4A:
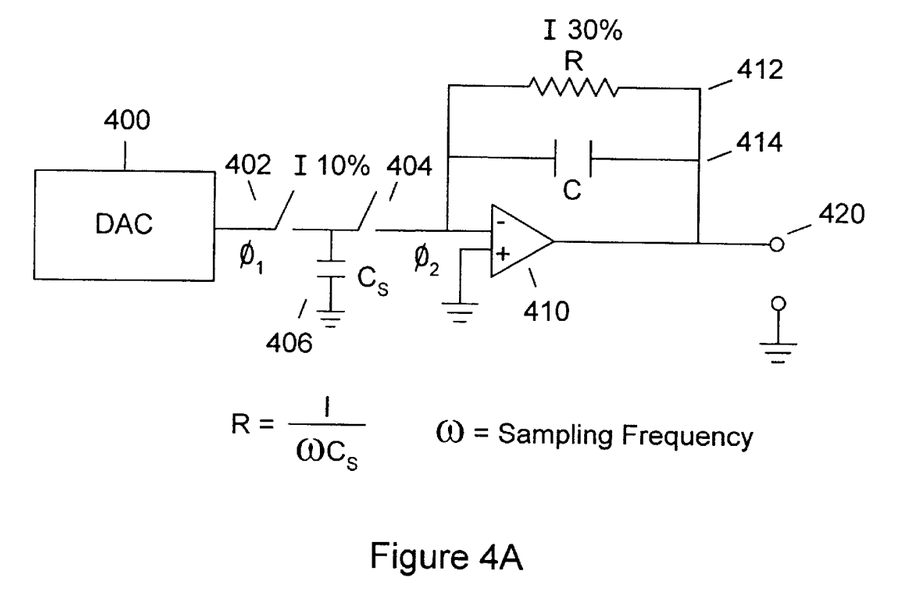
FIG. 4A is a block diagram of a reconstruction filter that samples the output of a DAC.

FIG. 4A is a block diagram of a reconstruction filter that samples the output of DAC 400. DAC 400 outputs analog values that correspond to the digital values input to the DAC using a plurality of bits. DAC 400 is connected to a sampling capacitor 406 by a sampling switch 402. When sampling switch 402 is closed, the output of the DAC is connected to the sampling capacitor 406, and an input switch 404 is open. When sampling switch 402 opens, input switch 404 closes. The period during which sampling switch 402 is closed is selected to occur when the output of DAC 400 is settling to its current desired output level. A timing diagram illustrating the DAC clock and the associated state of the two switches is provided in FIG. 4B.

Figure 4B:
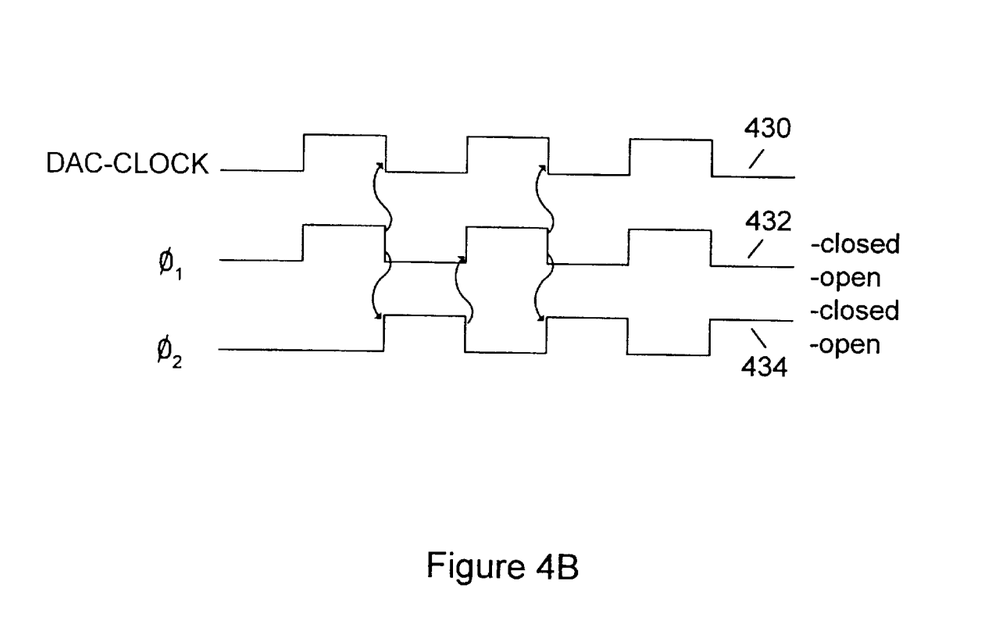
FIG. 4B is a timing diagram illustrating the timing relationship between the sampling switch, the input switch, and the DAC.

The instant of sampling (as defined by switch 402 in FIG. 4B) should be as close to the transition edge of the DAC as possible. Specifically, as indicated in FIG. 4B, the DAC transitions on the falling edge of DAC_CLOCK. The falling edge of φ1 defines the resampling instant into the reconstruction filter. It should be at least 0.5 to 1 nanosecond prior to the falling edge of DAC_CLOCK (as indicated by the arrows in FIG. 4B.) However, it can be significantly earlier than this, constrained by the DAC settling performance.

When this sampling input arrangement is used, the input applied to an amplifier 410 when input switch 404 is closed is a narrow current pulse created by the discharge of sampling capacitor 406. Amplifier 410 is configured as a lowpass filter with a feedback resistor 412 and capacitor 414. The output of the amplifier at a node 420 contains only the desired low frequency components of the DAC output. In particular, it filters out any component above $\omega_c=1/(RC)$, thus performing reconstruction.

Thus, a continuous time reconstruction filter circuit is connected to a discrete time input. The sampled discrete input does not contain distortions from glitching or slewing in DAC 400.

FIG. 4B is a timing diagram illustrating the timing relationship between the sampling switch, the input switch, and the DAC. The DAC transitions on the falling edge of DAC_CLOCK signal 430. A timing diagram 432 is also shown for the state of the sampling switch φ1. The switch is closed during a period when the DAC output is settling to its target value. A timing diagram 434 is also shown for the input switch φ2. The input switch closes just after the sampling switch is opened and the input switch opens just before the sampling switch closes. The closure of input switch 404 provides an impulse of current into the lowpass filter that approximates a perfect impulse. The negative feedback around amplifier 410 forces the charge originally on $C_s$ into the feedback RC network that includes resistor 412 and capacitor 414 at a rate proportional to the unity-gain bandwidth of amplifier 410.

The circuit depicted in FIG. 4A successfully removes the effect of glitching and slewing in the DAC from the output signal and also solves the problem of high frequency droop because instead of feeding a zero order held signal into the reconstruction filter, an impulse of current proportional to the DAC output is fed into the filter. Since there is no zero order held signal, the classical in-band sin x/x droop is not present. Instead, the distorted DAC output is resampled, eliminating the sin x/x term by transforming the zero order hold signal back into an impulse proportional to the DAC output. A typical output from such a system is shown in FIG. 6.

The zero order hold output spectrum of a realizable DAC is given in equation 1, along with the associated droop distortion. The input current to amplifier 410 is given in equation 2. The droop term has been eliminated by the sampling operation. The final output, resampled and droop free is given in equation 3.

$$V_{in}\left[\sum_{n=-\infty}^{\infty}(j(w-w_s n))\right] \times \left\{\frac{\sin(w/ws)}{(w/ws)}\right\}$$

$$Iin(w) = \frac{Cs}{T}\sum_{n=-\infty}^{\infty}V_{in}(j(w-w_s n))$$

$$V_{out}(jw) = \frac{C_s R}{T}\frac{\sum_{n=-\infty}^{\infty}V_{in}(j(w-w_s n))}{1+jwRC}$$

It should be noted that the gain of the circuit depicted in FIG. 4A is dependent on the feedback resistor 412 and the size of the sampling capacitor. When the circuit is manufactured, the value of resistor 412 may vary within a given manufacturing tolerance. Likewise, the capacitance of the sampling capacitor also varies within a tolerance and the variance of the feedback resistor is generally independent of the variance of the sampling capacitor. As a result, the gain of the circuit may vary as well. This is undesirable, since this implies that the digital input to the DAC results in an unknown analog output level. For applications where gain accuracy is critical (such as in a communications application like ADSL), eliminating this variability is especially important. Conventional techniques such as laser trimming are not desirable because they are generally expensive.

The gain of a reconstruction filter output is made more accurate in a manufactured circuit by replacing the feedback resistor by a switched capacitor network that mirrors the switched capacitor network used to sample the output of the DAC. This is illustrated in FIG. 4D.

Figure 4C:
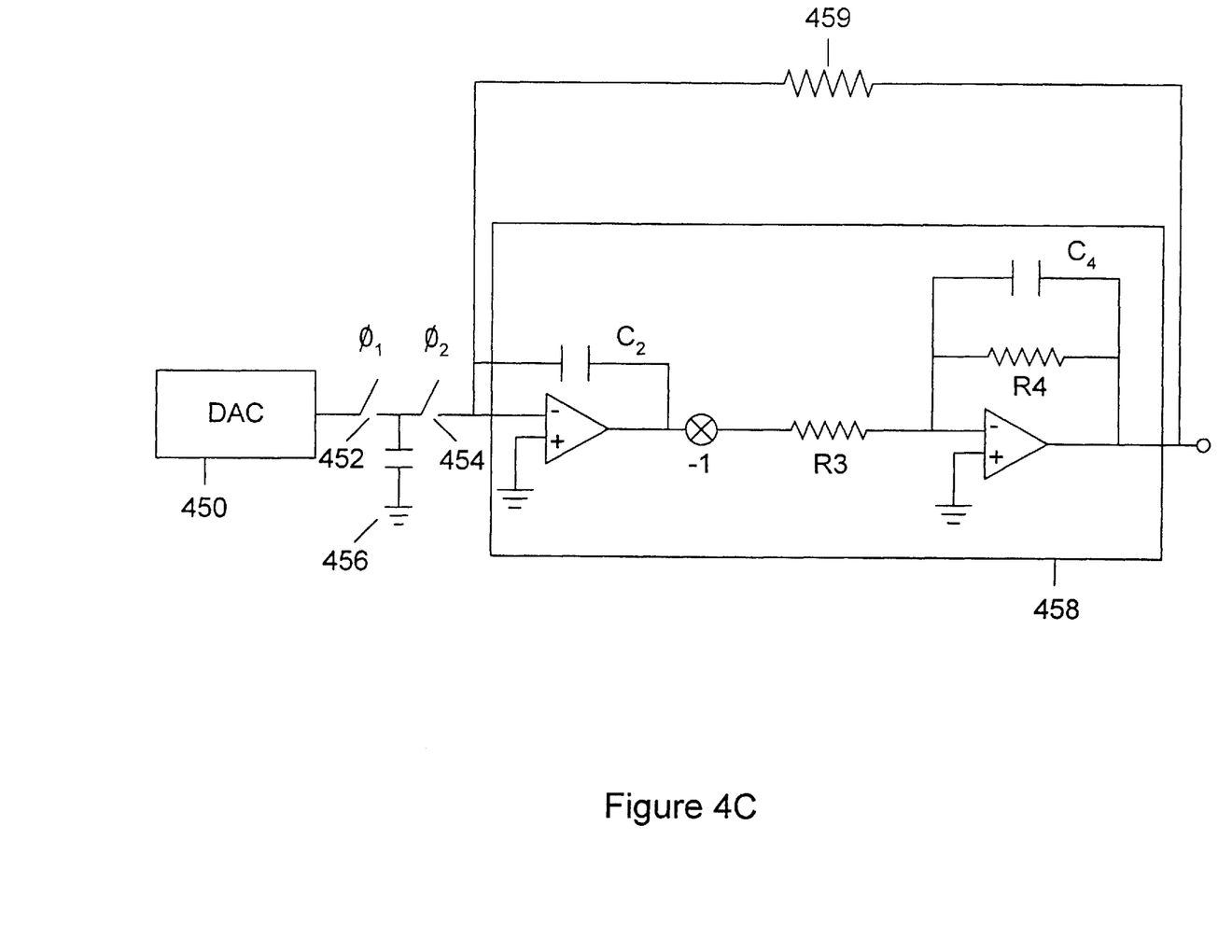
FIG. 4C is a block diagram illustrating a slightly more complex reconstruction filter utilizing the switched capacitor input technique.

FIG. 4C is a block diagram illustrating a slightly more complex reconstruction filter utilizing the switched capacitor input technique. The single amplifier 410 and capacitor 414 of FIG. 4A have been replaced by a biquad structure 458. As in FIG. 4A, DAC 450 outputs a signal to a sampling switch 452. When sampling switch 452 is closed, the output of DAC 450 is connected to a sampling capacitor 456. An input switch 454 connects the output of sampling capacitor 456 to biquad 458. Biquad 458 is configured as a low pass filter. In one embodiment, a Tow-Thomas lowpass biquad structure is used. The output of the reconstruction filter is provided at a node 466. The gain of the circuit depicted in FIG. 4C is dependent on feedback resistor 459 and the size of sampling capacitor 456. The timing for the switches relative to the DAC clock is the same as is shown in FIG. 4B.

Figure 4D:
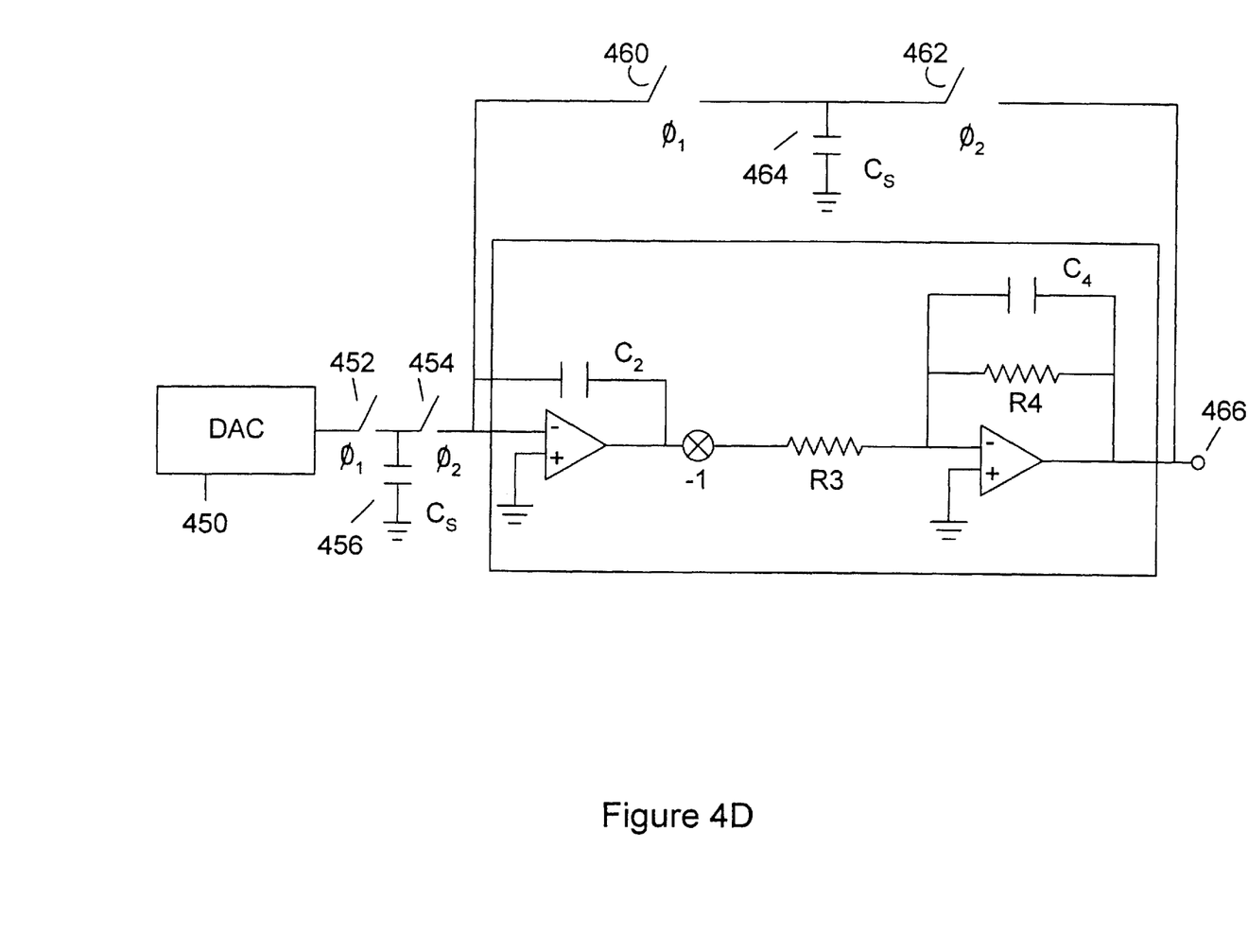
FIG. 4D is a block diagram illustrating another embodiment in which the feedback resistor is replaced by a switched capacitor network that mirrors the switched capacitor network used to sample the output of the DAC.

FIG. 4D is a block diagram illustrating another embodiment in which the feedback resistor is replaced by a switched capacitor network that mirrors the switched capacitor network used to sample the output of the DAC. Instead of a feedback resistor, the feedback loop of biquad 458 includes a first feedback switch 460 and a second feedback switch 462 as well as a feedback capacitor 464 that is the same size as sampling capacitor 456. The output of the reconstruction filter is provided at a node 466. Again, the timing for the switches relative to the DAC clock is the same as is shown in FIG. 4B.

The output of the reconstruction filter shown in FIG. 4C is described by equation 4.

$$V_{out}(jw) = \left\{ \sum_{n=-\infty}^{\infty} V_{in}(j(w-nw_s)) \right\} \left[ \frac{\frac{Cs}{T}H(jw)}{1 - \frac{Cs}{T}\sum_{n=-\infty}^{\infty} H(j(w-nw_s))} \right]$$

Where:

$$H(jw) = \left(\frac{-1}{jwc_2}\right)\left(\frac{R4/R3}{1 - jwR_4C_4}\right)$$

In a more general embodiment, $H(j\omega)$ is the transfer function of the structure around which the feedback switch is placed. When the switched capacitor feedback loop is used as shown in FIG. 4D, the gain of the reconstruction filter remains constant despite variations in the manufacturing process. The variances in the input sampling circuit are duplicated in the feedback loop.

It should be noted that in the embodiments shown above, the reconstruction filter is depicted as having a single amplifier or dual amplifier structure. In other embodiments, the reconstruction filter may include a more complex arrangement of amplifiers and circuits. However, it is sufficient to illustrate the benefits of the switched capacitor input circuit to consider the reconstruction filters shown. The examples given should not be considered to be limiting for the purpose of understanding the invention.

Figure 5:
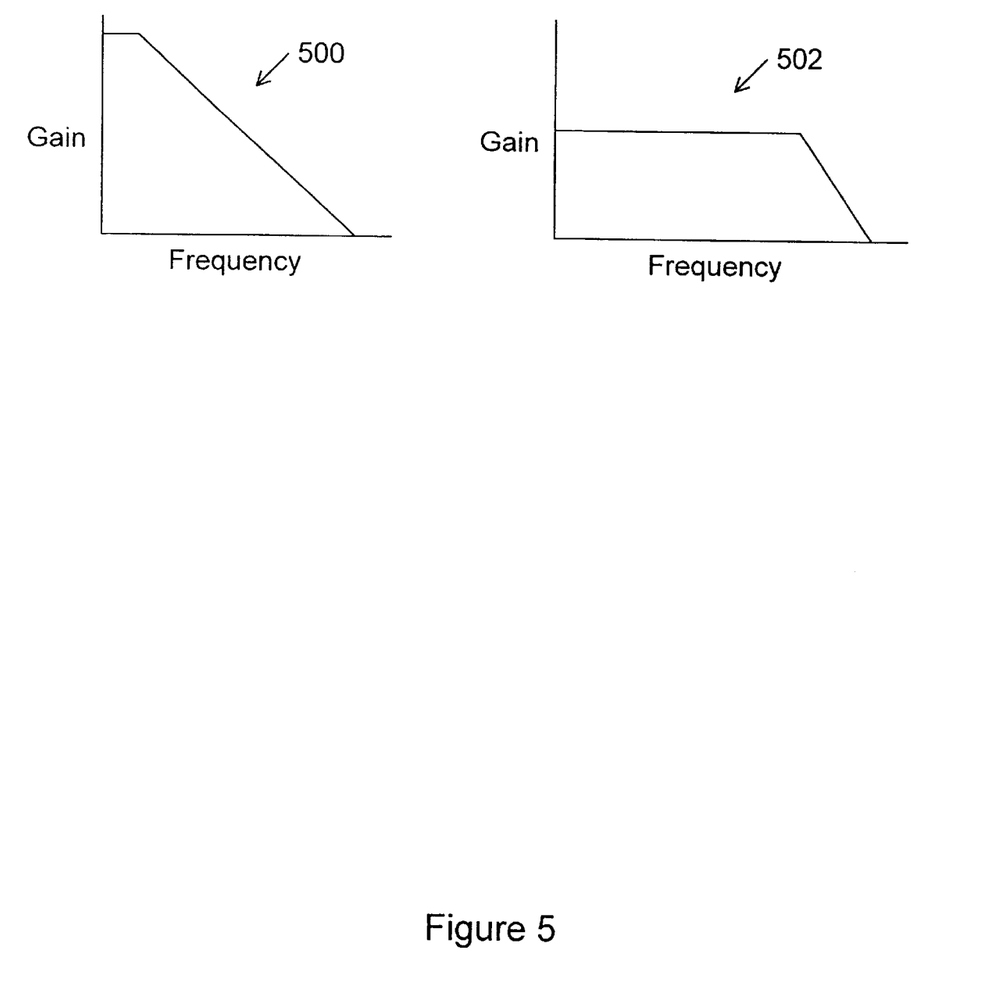
FIG. 5 illustrates a Bode plot 500 for an amplifier having a large DC gain.

In selecting the amplifier or amplifiers to be used in the reconstruction filter, amplifiers with a large gain bandwidth product may be chosen even though the DC gain of such amplifiers may be low. The use of the sampling input circuit requires an operational amplifier with as much gain bandwidth product as possible. In general, amplifiers with high DC gain tend to have a lower gain bandwidth for stability reasons, with the bandwidth decreasing faster than the gain increases. This is illustrated in FIG. 5. FIG. 5 illustrates a Bode plot 500 for an amplifier having a large DC gain. Also shown is a plot 502 for an amplifier having a lower gain, but greater gain bandwidth than the amplifier described by plot 500. In the reconstruction filter, DC gain can be reduced to increase the gain bandwidth, up to the limit that the continuous time gain accuracy requirements (typically 0.1%) are met.

In one embodiment of the present invention, an amplifier with a gain bandwidth product of between 900 MHz and 1.2 GHz is used. So long as the continuous time accuracy requirements are met, the reduced DC gain is not an issue. However, the increased gain bandwidth improves the impulse-like behavior of the charge transfer when the input switch is closed, which is critical for this application.

Figure 6A:
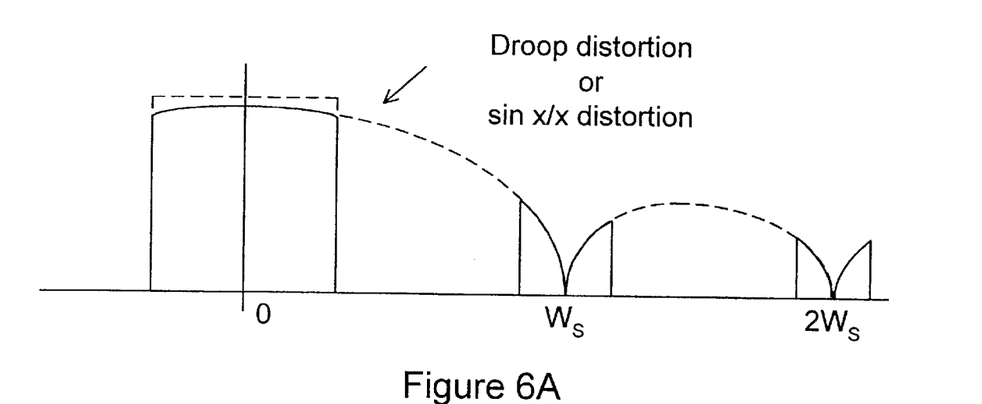
FIGS. 6A–6C are graphs illustrating the method by which the invention realizes a droop free structure.
Figure 6B:
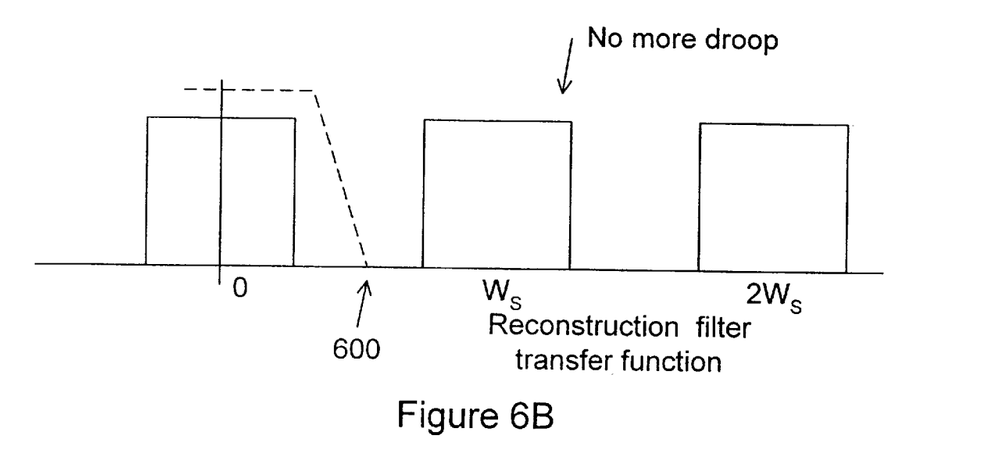
Figure 6C:
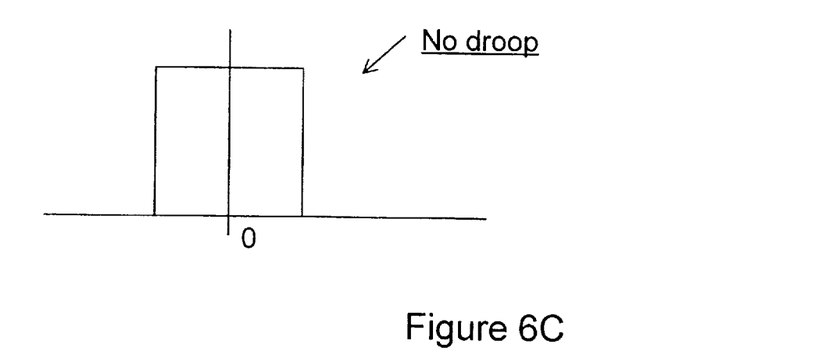

FIGS. 6A–6C are graphs illustrating the method by which the invention realizes a droop free structure. In FIG. 6A, the DAC output spectrum is shown, along with the intrinsic droop of a zero order hold signal. FIG. 6B shows the spectrum of the current applied to the reconstruction filter through the input switch, which shows the eliminated droop. Finally, FIG. 6C illustrates the output of the reconstruction filter, having been lowpassed and eliminated the unwanted higher frequency images. Its output is clearly droop free, and the resampling process intrinsically eliminates any form of slewing or glitching distortion in the output signal.

A system has been disclosed for reconstructing the output of a DAC for modulation of an ADSL line that eliminates problems caused by droop, glitching, and slewing. Although the system disclosed is used for outputting an ADSL signal for modulating an ADSL line, it should be recognized that the sampled input scheme would be useful for reconstructing the signal from a DAC in other applications. Furthermore, the reproduction of the input sampling circuit in the feedback loop of the amplifier of the reconstruction filter would also be useful in other applications where the gain tolerance of the reconstruction filter is tight.

Although the system described herein is applied specifically for the purpose of generating a data signal to be sent on a ADSL line, it should be recognized that the method disclosed of coupling a reconstruction filter to a digital-to-analog converter could applied in other cases where a digital-to-analog converter is used to generate a signal that drives an output.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An ADSL transmission system comprising:
   a digital DMT generating modulation circuit that generates a DMT modulated digital output;

a digital to analog converter that converts the DMT modulated digital output into a DMT analog signal;

a discrete pulse generating circuit that samples the DMT analog signal, the discrete pulse generating circuit outputting a pulsed output signal;

an amplifier having an input coupled to the output of said discrete pulse generating circuit and outputting an amplified pulsed output signal, wherein said amplifier includes a feedback loop coupled between the input of said amplifier and an output of said amplifier;

a reconstruction filter that is driven by the amplified pulsed output signal wherein the reconstruction filter outputs a line driving signal that is suitable to drive an ADSL communication line;

whereby a line driving signal is produced that reduces distortion caused by imperfections in the digital to analog converter.

2. An ADSL transmission system as recited in claim 1 wherein the discrete pulse generating circuit samples the DMT analog signal at a point in time where the DMT analog signal has settled at a substantially stable value.

3. An ADSL transmission system as recited in claim 1 wherein the discrete pulse generating circuit that samples the DMT analog signal includes an input switched capacitor connected to the input of the amplifier.

4. An ADSL transmission system as recited in claim 3 wherein the switched capacitor is charged by the output of the digital to analog converter and the input switched capacitor is discharged into the input of the amplifier.

5. An ADSL transmission system as recited in claim 3 wherein the feedback loop includes a feedback switched capacitor that is substantially the same as the input switched capacitor.

6. An ADSL transmission system as recited in claim 3 wherein the amplifier includes an operational amplifier with a gain bandwidth product between 900 MHz and 1.2 GHz.

7. A method of driving an ADSL communication line with a DMT signal comprising:

creating a DMT modulated digital output;

converting the DMT modulated digital output to a DMT analog signal;

sampling the DMT analog signal;

generating a discrete pulse output signal from the sampled DMT analog signal;

applying the sampled DMT analog signal to the input of an amplifier;

feeding back the output of the amplifier to the input of the amplifier; and applying the output of the amplifier to a reconstruction filter that outputs a line driving signal that is suitable to drive an ADSL communication line.

8. A method of driving an ADSL communication line with a DMT signal as recited in claim 7 wherein the DMT analog signal is sampled at a point in time where the DMT analog signal has settled at a substantially stable value.

9. A method of driving an ADSL communication line with a DMT signal as recited in claim 7 wherein the DMT analog signal is sampled using an input switched capacitor connected to the input of the amplifier.

10. A method of driving an ADSL communication line with a DMT signal as recited in claim 9 wherein the step of feeding back the output of the amplifier to the input of the amplifier includes using a feedback switched capacitor that is substantially the same as the input switched capacitor.

11. A reconstruction filter comprising:

an input configured to receive an output signal from a digital to analog converter;

an input sampling circuit operative to store a sample of the output signal &am the digital to analog converter;

an input pulse generating switch that generates a pulse, the energy of the pulse being determined by the sample of the output signal from the digital to analog converter;

an amplifier that receives the pulse at an amplifier input and provides an output signal at an amplifier output;

a feedback loop from the amplifier output to the amplifier input;

whereby an output signal is produced that reduces distortion caused by imperfections in the digital to analog converter.

12. A reconstruction filter as recited in claim 11 wherein the feedback loop includes a feedback loop sampling circuit that is substantially the same as the input sampling circuit and a feedback loop pulse generating circuit that is substantially the same as the input pulse generating circuit.

13. A reconstruction filter as recited in claim 11 wherein the reconstruction filter is used to drive an ADSL communication line.

\* \* \* \* \*